United States Patent [19]

Hale et al.

[11] Patent Number: 5,502,836
[45] Date of Patent: Mar. 26, 1996

[54] METHOD FOR DISK RESTRIPING DURING SYSTEM OPERATION

[75] Inventors: Robert P. Hale; Robert J. Beard, both of Irvine, Calif.

[73] Assignee: AST Research, Inc., Irvine, Calif.

[21] Appl. No.: 504,144

[22] Filed: Jul. 19, 1995

Related U.S. Application Data

[63] Continuation of Ser. No. 795,658, Nov. 21, 1991, abandoned.

[51] Int. Cl.$^6$ ................................................ G06F 11/20
[52] U.S. Cl. ............... 395/497.01; 395/439; 395/182.01; 369/44.27; 369/47; 371/49.1; 371/20.1
[58] Field of Search ..................................... 395/425, 725, 395/575, 439, 497.01, 182.01, 182.03, 182.04; 371/8.1, 9.1, 10.1, 11.1, 11.2, 49.1; 369/44.27, 47

[56] References Cited

U.S. PATENT DOCUMENTS

| | | | |
|---|---|---|---|
| 4,775,978 | 10/1988 | Hartness | 371/40.1 |
| 5,134,619 | 7/1992 | Henson et al. | 371/40.1 |
| 5,140,592 | 8/1992 | Idleman et al. | 395/182.03 |
| 5,179,704 | 1/1993 | Jibbe et al. | 395/725 |
| 5,210,860 | 5/1993 | Pfeffer et al. | 395/183.18 |
| 5,285,451 | 2/1994 | Henson et al. | 395/182.04 |

OTHER PUBLICATIONS

Chang, C. C., *Application of Principle Component Analysis to Multi–Disk Concurrent Accessing*, BIT, vol. 28, No., 2, 1988, pp. 205–214.

Kim, Michelle Y., *Synchronized Disk Interleaving*, IEEE Transactions On Computers, vol. C–35, No. 11, Nov. 1986.

Katz, et al., *A Project on High Performance I/O Subsystems*, Computer Architecture News, vol. 17, No. 5, Sep. 1989, pp.24–31.

Reddy, A. L. Narasimah, *A Study of Parallel Disk Organizations*, Computer Architecture News, vol. 17, No. 5, Sep. 1989, pp. 40–47.

Olson, Thomas M., *Disk Array Performance in a Rnadom IO Environment*, Computer Architecture News, vol. 17, No. 5, Sep. 1989, pp. 71–77.

Dibble, et al., *Beyond Striping: The Bridge Multiprocessor File System*, Computer Architecture News, vol. 17, No. 5, Sep. 1989, pp. 32–39.

Peterson, Donald A., *Redundant Disk Arrays Enhance Data Safety to Support Network Servers*, Computer Technology Review, Winter 1990, pp. 44–47.

Digital Equipment Co., *Vax Disk Striping Driver for VMS: Supercomputer–class I/O on your VAX System*, 1989.

Intel Corporation, 82355 *Bus Master Interface Controller Preliminary Data Sheet*, Peripheral Components, Oct. 1990.

*Primary Examiner*—Tod R. Swann
*Assistant Examiner*—James Peikari
*Attorney, Agent, or Firm*—Knobbe, Martens, Olson & Bear

[57] ABSTRACT

A method for restriping a striped disk array in a computer system without requiring the removal of the system from normal operation provides an efficient method to expand the disk array and incorporate the new storage into the striping scheme. When the operating system is not requesting access to the hard disk subsystem, the data is repositioned. The data on the array need not be backed-up onto alternate media before the array is expanded. Once new storage space is installed, the data is repositioned from disk to disk under the control of a disk controller until a stripe of the new array is expanded. Pointers stored in non-volatile memory maintain the location of the next free location and the next data block to be repositioned. The pointers are also used by the disk controller to locate the files during the array expansion process. The process is repeated until all of the data is relocated in the expanded array. After the relocation is complete, empty storage at the end of each disk remains. Once a new driver is installed to properly report the new volume to the operating system, the controller reports this new space as a separate volume of available memory storage to the operating system.

5 Claims, 6 Drawing Sheets a continuation of U.S. patent application Ser. No. 07/795,658, filed Nov. 21, 1991, now abandoned.

METHOD FOR DISK RESTRIPING DURING SYSTEM OPERATION

This application is a continuation of U.S. patent application Ser. No. 07/795,658, filed Nov. 21, 1991, now abandoned.

BACKGROUND OF THE INVENTION

1. Field of the Invention

The present invention relates to upgrading striped disk arrays for computer systems. Specifically, the present invention involves a method for increasing the capacity of a disk array without removing the system from normal operation.

2. Description of the Related Art

Modern computer technology is providing significant improvements in computing speed with faster processors and faster memory access times. However, because disk technology has not advanced commensurate with processor technology, the hard disk subsystem is often the main bottleneck in today's computer systems. Disk arrays, which consist of more than one disk configured as a single disk, provide a possible solution to increase hard disk system performance. A common method to decrease disk access time is to stripe the data across the disks in the array, as is well known in the art. See, e.g., Kim, *Synchronized Disk Interleaving*, IEEE Transactions on Computers, Vol. C-35, No. 11, pp. 978–988 (November 1986). One complication with disk arrays is that failure of one disk often causes a loss of a significant portion of data from many of the files on the array because a single file may span multiple disks in the array.

To overcome the reliability problem, many disk arrays employ one of the five logical disk geometries (LDGs) termed a "Redundant Array of Inexpensive Disks" (RAID) as proposed by researchers at the University of California at Berkeley. For instance, RAID 4 and RAID 5 are typical LDGs of arrays that are striped along boundaries of a selected size. In RAID 4 and RAID 5 arrays, each stripe of the selected size includes parity to provide redundancy. In RAID 4, one disk in the array is used for parity, and in RAID 5, the parity is distributed throughout the disks in the array rather than being placed on a single disk. The parity defined in RAID 4 and RAID 5 is the exclusive-OR of the data on corresponding striped blocks of the other disks in the hard disk subsystem, as is well known in the art. Redundant disk arrays improve reliability by enabling the reconstruction of lost data in the event one disk fails; however, they increase the complexity of the hard disk subsystem.

Increasing the capacity of a striped disk array is complex, and redundancy further complicates this process. For instance, in order to add a new disk to an existing striped array, the striping should incorporate the new disk. However, this generally entails reconfiguring the system. In one conventional method, all data in the existing array is first backed up. Commonly, disks used in disk arrays hold approximately one gigabyte of data each, and system backups are generally performed using magnetic tapes which hold significantly less data than the disk array. Therefore, the system backup requires copying data to multiple tape cartridges. A significant amount of operator time is required to monitor the backup and change the tape cartridges as they become full. Even without operator time, the entire process of transferring large amounts of data is time intensive. After the data is backed up, the new disk drive is installed. Subsequently, the system driver is configured to incorporate the space from the new disk into the array. Next, the new disk array is reformatted using the operating system's utilities. This configures the entire expanded array as one or more volumes with data striped across all the drives in the array. Finally, the data is transferred from the backup tape to the new array and, if employed, all redundancy (e.g., parity) is recalculated to incorporate the added storage. Generally, the hard disk system is removed from normal operation during the entire process. This is costly because the entire system is rendered inoperable during the upgrade.

An alternative procedure to upgrade such a disk array is to simply add a disk to the array and not incorporate it into the striping scheme. In other words, a new disk can simply be added as a new volume in and of itself. However, this is disadvantageous because the striping does not incorporate the new disk drive with the rest of the array. The new disk stands alone as an independent volume. Therefore, the performance increases gained by striping are minimized by the new volume which is not striped.

It would be advantageous to minimize or eliminate the CPU down time that is commonly required when a new disk is added to a striped disk array by current methods. It would be further advantageous to alleviate the necessity of backing up the old data before repositioning the old data onto the expanded disk array. Additionally, it would be beneficial for the added disk storage to be incorporated in the striping of the original disk array to take advantage of the increased performance of a striped disk array.

SUMMARY OF THE INVENTION

The present invention provides a method for upgrading the capacity of a striped disk array in a computer system without requiring removal of the system from operation. The capacity of the array is increased by adding additional storage media (e.g., one or more hard disk drives) which can be incorporated into the disk array without backing up the data from the original disk array. This saves time and system resources. The method involves restriping the data across the expanded disk array, one block at a time (i.e., a block being the data stored on a disk within the boundaries defined by the selected stripe size), while the system remains in operation.

In one embodiment, the restriping of the data occurs during periods while the operating system is not requesting access to the hard disk subsystem. This minimizes any interference with system operation because the restriping occurs during periods when the disk subsystem is otherwise idle. Advantageously, the data is repositioned one block at a time, and access to the disk array is prevented during relocation of a data block in the array. In an alternative embodiment, the blocks for each disk in the array may be relocated until one or more rows (i.e., data blocks of the selected size for all disks) in the array are restriped to incorporate the new drive (or drives). The data restriping proceeds by repositioning blocks of data from disk to disk under control of a hard disk controller. The status of the restriping is maintained by updating pointers after each block of data is relocated. One pointer indicates the next free location in the array, and another pointer indicates the location of the next data block to be relocated. The hard disk controller also uses the pointers in conjunction with the address sent by the computer operating system to request access to the disk array, to determine where data is currently located in the array. The data transfer process is repeated until all data has been relocated and the added disk is incorporated into the striping of the array.

Once the restriping of the data is complete, each disk in the array has available storage space at its physical "end." The available space at the end of the disks is configured as a new volume of striped disk storage in the array.

One aspect of the present invention involves a method of expanding a striped hard disk array with at least two physical disk drives with data striped across the disks. A hard disk controller controls the disk array and receives requests for access to the array from a computer operating system. In one embodiment, the method involves adding at least one physical disk drive to the disk array to add additional storage locations, selecting a row in the disk array for expansion to incorporate a portion of the added disk, waiting for a predetermined delay period during which the operating system issues no requests for access to the disk array, preventing access by the operating system to the disk array once the predetermined period expires, selecting a data block in the disk array for expansion, relocating the data block to fill a storage location created in the selected row by the addition of the added disk drive, identifying with a first indicator the next free location in the array to be expanded, identifying with a second indicator the next data block in the array to be relocated, and permitting the operating system to access the hard disk array.

In another embodiment, the method further involves waiting a predetermined delay period during which the operating system issues no requests for access to the disk array if such a request was pending when the operating system is permitted to access the hard disk array, and again preventing access to the disk array, and repeating the transfer process until all rows in the disk array incorporate the new disk drive. Once the entire array is expanded, each disk will have free storage space at its physical end. This space is configured as a new volume.

In a further embodiment, the disk array is a RAID 4 system having existing parity for each row in the array which contains data. The parity is stored in the last disk in the array for each row. In this embodiment, the method further involves copying the existing parity for a stripe of data to a temporary storage location before expanding a stripe in the array, setting a flag to indicate that the existing parity is located in the temporary storage location, calculating a new parity for the row incorporating a portion of the new disk drive, storing the new parity in the last disk in the selected row, and clearing the flag which indicates that the parity is in the temporary storage location.

In yet another embodiment, the striped disk array is a RAID 5 system having parity for each stripe in the array. The parity for each stripe is distributed among the disks in the array. In the RAID 5 embodiment, the method further involves copying the entire selected row of data, including the parity, from the hard disk array to a temporary storage location, setting a flag to indicate that the selected row is located in the temporary storage location, calculating a new parity for the expanded row, storing the new parity in a predetermined disk in the expanded row, and clearing the flag.

According to another aspect of the invention, the method involves handling a disk access request issued to the hard disk controller while the expansion is in progress. According to this aspect of the invention, the method further involves, determining if the data requested is stored before or after the row indicated by the first indicator, and accessing the appropriate location in the disk array by calculating the location of the data accounting for the disks in the expanded array if the request is before the location referenced by the first indicator or accounting for the disks in the original array if the request is after the location references by the first indicator.

DETAILED DESCRIPTION OF THE PREFERRED EMBODIMENT

Figure 1:
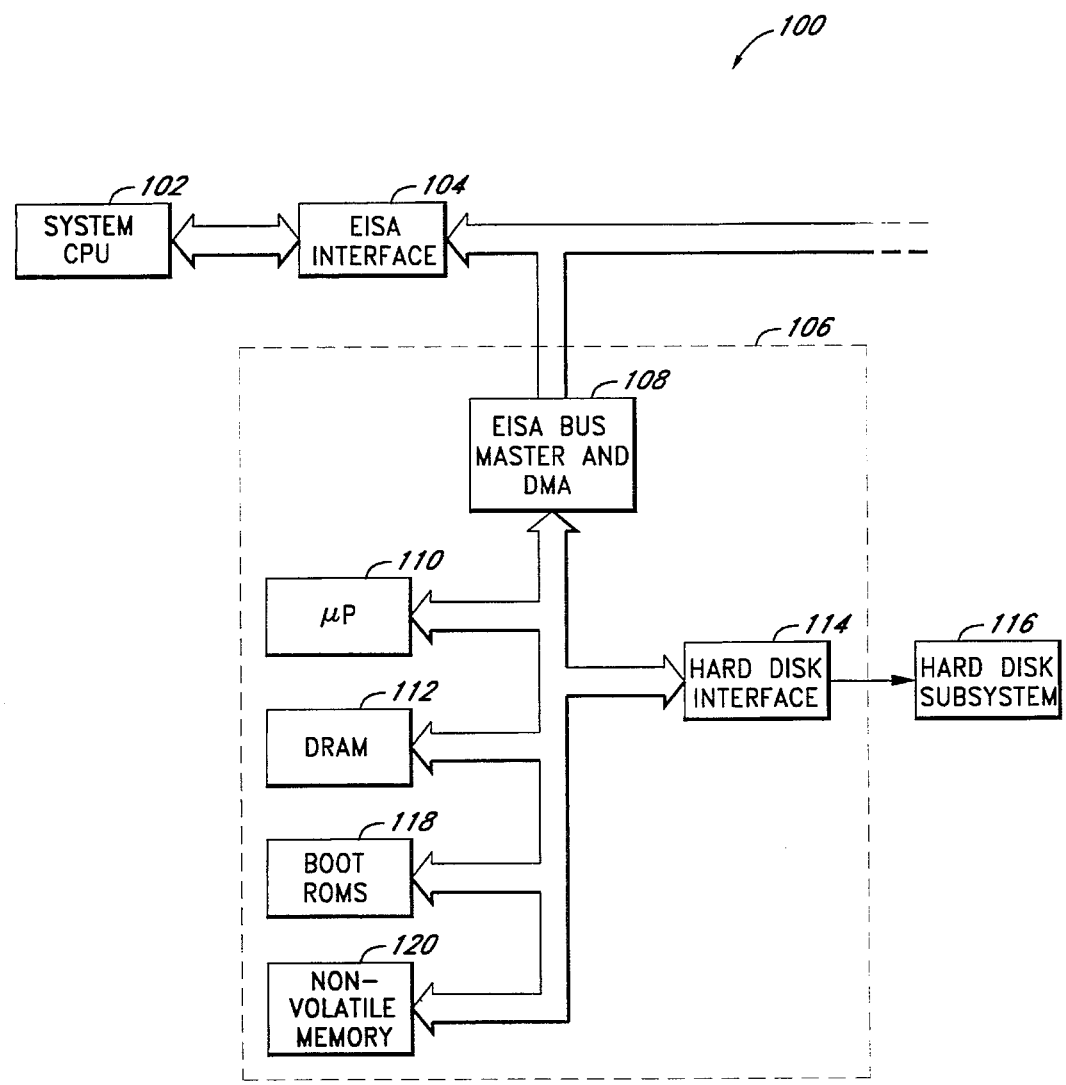
FIG. 1 depicts a block diagram of an exemplary computer system with a hard disk controller and a hard disk subsystem.

FIG. 1 illustrates an exemplary computer system 100 with a system central processing unit (CPU) 102, an EISA bus interface 104 and a hard disk controller 106. Advantageously, the hard disk controller 106 comprises a conventional EISA bus master 108 with direct memory access (DMA) capabilities, a microprocessor 110 (e.g., an Intel 80486 or AMD 29000), a Dynamic Random Access Memory (DRAM) 112, a hard disk interface 114 connected to a hard disk subsystem (HDS) 116, boot Read Only Memories (ROMs) 118 and a nonvolatile RAM 120.

In an exemplary embodiment of the present invention, the EISA bus master 108 comprises an Intel 82355 Bus Master Interface Controller, as described in Intel, *Peripheral Components* 1991, Intel: Santa Clara, Calif., 1991. In the present embodiment, the hard disk interface 114 comprises a small computer systems interface (SCSI) channel, as is well known in the art. Additionally, the boot ROMs 118 advantageously comprise an EISA bus compatible boot ROM, as is well known in the art, and a hard disk controller boot ROM with boot instructions for the microprocessor 110 (e.g., boot instructions for the Intel 80486 if the processor is an Intel 80486). The boot ROMs may also potentially include the disk geometry software for the hard disk subsystem 116. Preferably, the EISA bus compatible boot ROM is also accessible by the system CPU 102.

In an alternative embodiment, the disk geometry software is stored on a few sectors of one or more hard disks in the hard disk subsystem 116. Storing the disk geometry software on the hard disks rather than in the hard disk controller boot ROM decreases the necessary size of the boot ROMs 118 and simplifies updates because the disk geometry software is stored on a disk rather than in a ROM. This software is downloaded to the DRAM 112 during initialization operations. Advantageously, if the disk geometry software is stored on the hard disks, the hard disk controller 106 "hides" the boot sectors from the operating system by simply adding the size of these sectors to any disk request. In yet another embodiment, the disk geometry software is stored on all of the hard disks in the hard disk subsystem 116 to increase reliability.

Advantageously, the DRAM 112 comprises a common increment of memory (e.g., one megabyte) for use in the hard disk controller 106, and the nonvolatile RAM 120 comprises a common increment (e.g., 8 Kbytes) of a complementary metal oxide semiconductor (CMOS) memory, battery backed up RAM, or other nonvolatile memory, as is well known in the art.

Advantageously, the present embodiment provides a SCSI channel as the interface 114 for use with conventional disk arrays. Conventional SCSI channels handle up to seven physical hard disk units, as is well known in the art. This is sufficient for addressing several gigabytes of storage using RAID 5 with currently available hard disks, with additional capacity as hard disk units increase in capacity. Moreover, a hard disk controller similar to the hard disk controller 106 shown in FIG. 1 could support several SCSI channels. Preferably, the hard disk controller 106 configures all of the hard disks that it controls as one or more hard disk volumes as presented to the operating system, as is well known in the art.

Desirably, the hard disk drives used in the hard disk subsystem 116 support for "connect" and "disconnect" operations. As is well understood in the art, this allows for multiple outstanding requests on the same bus. In other words, each device connected to the interface is capable of receiving a request and then releasing the bus while processing the request. After one device has "disconnected" and is processing its request, another request can be issued on the same bus to another device.

In one embodiment, the hard disk subsystem 116 advantageously comprises an array of striped disks (e.g., a RAID subsystem, or any other striped disk array).

Figure 2:
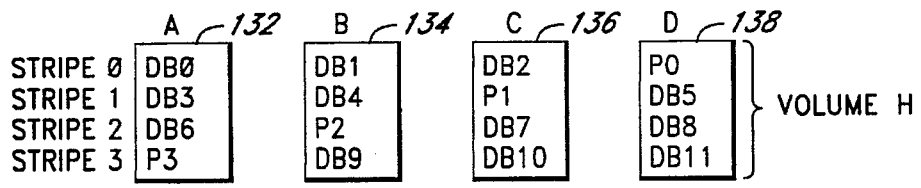
FIG. 2 illustrates a symbolic diagram of a RAID 5 hard disk subsystem with data and parity striped across four disks.

FIG. 2 depicts a symbolic representation of a RAID 5 hard disk subsystem 130 as an example of an appropriate hard disk subsystem 116. The RAID 5 array 130 depicted has four hard disks—disk A 132, disk B 134, disk C 136 and disk D 138. This hard disk subsystem 130 is chosen for explanation because of its reliability. Additionally, the RAID 5 system is a significantly complex system upon which to apply the present invention because the controller 106 maintains and monitors the parity and its location in each data stripe. The present methods are also adaptable to any striped disk array of any size or type including non-parity oriented systems and systems that use simple parity schemes such as RAID 4.

In FIG. 2, the data is shown striped in blocks across the four hard disks 132, 134, 136 and 138. In the exemplary array 130, the entire disk array 130 is configured as volume H, a single volume of memory storage as presented to the operating system by the hard disk controller 106. Data blocks are labelled "DBx" in FIGS. 2–4. In the symbolic diagram, the data blocks DBx represent a segment of storage on the corresponding disk equal in size to the defined stripe size for the disks. In one embodiment, a common data block size is one cylinder of storage. For instance, if the operating system requests that a file three cylinders in length be stored on the disk array 130 starting at the beginning of the array, the controller 106 would store the file across the stripe 0 locations of disk A 132, disk B 143, and disk C 136. Thus, storage space is used from block to block across the disks in the array, as is well known in the art. For purposes of discussion, the rows depicted in the hard disks in FIG. 2 represent stripes of data on the hard disks, as is well known in the art. For simplicity, only four stripes—stripe 0, stripe 1, stripe 2 and stripe 3—are depicted.

According to the conventional RAID 5 algorithm, the parity stored at the stripe 0 location of drive D 138, designated as P0, is the result of exclusive-ORing the data blocks at stripe 0 of the other disk drives—data block DB0 on drive A 132, data block DB1 on drive B 134, and data block DB2 on drive C 136.

Similarly, the parity on stripe 1 of drive C 136, designated as P1, is the exclusive-OR of the data blocks of stripe 1 of the other disk drives in the array 130—data block DB3 on drive A 132, data block DB4 on drive B 134, and data block DB5 on drive D 138.

The parity stored on stripe 2 of drive B 134, designated as P2, is the exclusive-OR of the data blocks at stripe 2 of the other disks in the array 130—data block DB6 on drive A 132, data block DB7 on drive C 136 and data block DB8 on drive D 138.

The parity stored on stripe 3 of drive A 132, designated as P3, is the exclusive-OR of the data blocks at stripes 3 of the other disks in the array 130—data block DB9 on drive B 134, data block DB10 on drive C 136 and data block DB11 on drive D 138. The calculation of the parity according to the RAID 5 protocol is well known in the art.

Figure 3:
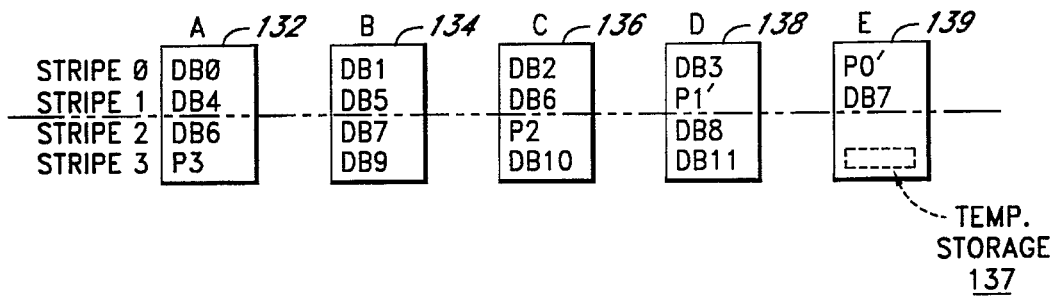
FIG. 3 illustrates a symbolic diagram of a RAID 5 hard disk subsystem during the process of disk restriping according to the present invention.

In FIG. 3, the disk subsystem 130 of FIG. 2 is shown as the hard disk system 131 during the process of expansion to include an added disk drive E 139. According to the present invention, the added disk drive E 139 is striped with data blocks of the same size (e.g., one cylinder is a common increment) as in the four disk system 130. FIG. 3 shows the expanding disk array 131 after stripe 0 and stripe 1 for all appropriate disks have been re-striped and their new parity blocks, P0' and P1' respectively, have been calculated.

The present invention involves a method of relocating the data blocks stored in the hard disk system 130 into the expanded hard disk system 131 without requiring that the CPU 102 be removed from normal operation. In general, the hard disk controller 106 transfers one data block at a time until the new disk is incorporated into the striping of the array. Advantageously, the transfers are executed during lulls in I/O (i.e., the operating system is not requesting access to the disk array 116.)

The controller 106 monitors the progression of the restriping by updating progression pointers which may be maintained in the nonvolatile memory 120. In an alternative embodiment, as described above, the progression pointers may be stored on the first disk drive A 132, or any other disk drive, or on all of the disk drives 132, 134, 136, 138 and 139. In one embodiment, one pointer (hereinafter the "next-free pointer") indicates the next location in the array with free storage space, and another pointer (hereinafter the "next-block pointer") indicates the location of the next data block in the array to be relocated. Additional pointers and/or flags may be used to monitor progression of other parameters during the restriping process. Use of additional pointers and flags is best understood with respect to the more detailed discussion of restriping below.

Figure 4:
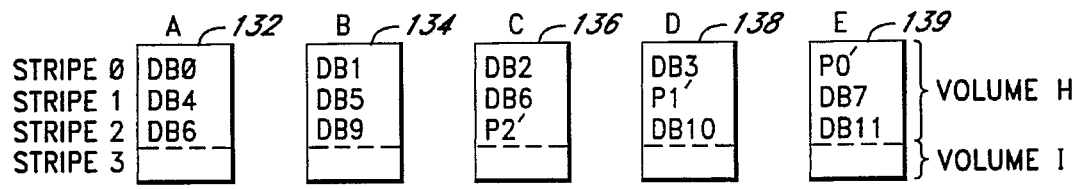
FIG. 4 illustrates a symbolic diagram of a RAID 5 hard disk subsystem after restriping is complete and a new volume has been defined.

To illustrate the method of the present invention, an upgrade from the four-disk RAID 5 system shown in FIG. 2 to the five-disk RAID 5 system shown in FIG. 4 is explained in more detail below. The system depicted in FIG. 2 has four disks reported by the hard disk controller 106 as a single volume (volume H) to the operating system. In other embodiments, the disk array 130 could be configured as more than one volume, as is well understood in the art. Accordingly, in the embodiment depicted in FIG. 2, the operating system requests access to the disk array 130 as a single disk volume. In other words, the operating system accesses the hard disk array 130 with logical addresses relative to the beginning of the volume H. The existence of the plurality of disk drives is transparent to the operating system. Furthermore, the presence of parity in the array is transparent to the operating system. Therefore, the logical addresses provided by the operating system to the controller 106 exclude the parity. The controller 106 interprets the logical addresses to reflect the actual configuration of the array, as is well known in the art.

An additional physical disk drive E 139 has been added to the array 131 of FIG. 3. This disk drive E 139 could simply be added and configured as a new volume at the end of the array. However, if the new disk E 139 was configured as a separate volume, it would not be striped with the original disks in the array. Thus, increasing the capacity would degrade the performance of the array because any disk access to data stored in the added disk E 139 would not benefit from the decreased disk access time provided by the disk striping. Alternatively, all of the data from the original array could be temporarily stored on another storage device and then restriped onto the new array 131 with the added disk drive E 139 striped with the original disks of the array 130. As previously explained, the process of backing up the entire array and restriping the data can be very time intensive, and generally requires removing the system from operation.

According to the present invention, the disk drive E 139 is added, and the entire array is restriped, without backing up the array and without necessitating the removal of the array from normal user operations. The restriping proceeds as explained below.

In general, once the new disk drive E 139 (or multiple disk drives) is added, the hard disk controller 106 sequentially relocates blocks of data one at a time into the free space created by the addition of the new disk drive E 139. In one embodiment, the data blocks corresponding to and including a selected parity block (hereinafter referred to as a "row") of the unexpanded array are copied into a temporary storage area 137 at the end of the added disk E 139 before restriping of the row to incorporate the disk drive E 139 occurs. This allows recovery of data if the system crashes during the data transfer operation. During restriping of a row in a system with parity, a flag is set and stored in the nonvolatile memory 120 to indicate that the parity and corresponding data for the row being processed is located in the temporary storage 137. In an alternative embodiment, this flag is located in the hard disks 132, 134, 136, 138, and 139. Once a row of data is stored in the temporary storage 137, the data blocks which follow the free space created by the added disk are transferred by the hard disk controller 106 to fill the empty space, as explained in more detail below. Advantageously, the restriping occurs during periods when I/O requests are at a lull (i.e., the disk controller 106 receives no I/O requests for the disk array for a predetermined period of time).

For the RAID 5 array shown in FIG. 3, the controller 106 begins restriping at stripe 0. The controller first waits for a lull in I/O. Once the controller 106 detects a lull, the hard disk controller 106 copies the entire stripe 0 with data blocks DB0–DB2 along with the original parity P0 into the temporary storage 137. A flag (hereinafter the "temporary storage flag") is then set to indicate that the data and parity for stripe 0 is located in the temporary storage 137. DB0–DB2 remain at the original location because no free space is created before these blocks by the addition of the disk drive E 139. In accordance with conventional RAID 5 algorithms, the parity for the first row of data resides on the last disk in the row. Therefore, in the expanding array 131, the parity will reside on the new disk drive E 139 which is the last disk in the row of the expanding array 131. The original stripe 0 location on drive D 138 is designated to contain data in the expanding array 131. The next data block following DB2 is DB3 on drive A 132 at stripe 1. Accordingly, the hard disk controller 106 moves DB3 from the stripe 1 location on drive A 132 to the stripe 0 location on drive D 138.

As previously mentioned, progression pointers maintain the status of the relocation of data blocks. The next-free pointer maintains the position of the next-free location to receive a data block, and the next-block pointer maintains the position of the next data block to be relocated. These pointers are advanced after each transfer of a data block, as is further explained herein. Thus, after DB3 is relocated, the next-free pointer references the stripe 0 location of drive E 139, and the next-block pointer references the stripe location of drive B 134. Each location between the next-free and next-block pointers is the available storage space obtained by the incorporation of storage space from the added disk drive. This "bubble" between the progression pointers of available storage increases with each row as additional storage from the added disk drive E 139 is incorporated into the array 131.

Because the stripe 0 location of drive E 139 is the appropriate parity location for the expanding array, and because the next-free pointer references this location, the controller 106 recalculates the parity to obtain the new parity P0' which is the exclusive-OR of DB0, DB1, DB2 and DB3. For stripe 0, the new parity may be calculated by simply exclusive-ORing the original parity, P0, with DB3. The controller 106 then stores the new parity, P0', at the stripe 0 location of the new drive E 139. Once the parity is recalculated, the next-free pointer is advanced to reference the stripe 1 location of drive A 132.

Once the first row is completed, the temporary storage flag is cleared because the parity for stripe 0 is now located on disk E 139 in its appropriate location.

Before the controller 106 relocates another data block, the controller 106 again checks to determine if any I/O requests are pending. If no requests are pending, the controller 106 proceeds with the next data block. If a request is pending, the hard disk controller 106 services the request, waits for a lull, and then proceeds with the next data block.

The next free location is the stripe 1 location of drive A 132, as indicated by the next-free pointer. Because a new row is involved, the controller 106 begins by transferring data from stripe 1 of the disk array 130 into the temporary storage 137. This overwrites some or all of the stripe 0 data that is located in the temporary storage 137. Next, a temporary storage flag is set to indicate that the parity block P1, and its corresponding data, for stripe 1 is stored in the temporary storage 137. The next data block, as indicated by the next-block pointer, is then relocated. As depicted, DB4 is the next data block to be moved. Accordingly, DB4 is relocated from the stripe 1 location of drive B 134 to the stripe 1 location of drive A 132. The progression pointers are then advanced one location. Accordingly, the next-block pointer now references the parity P1 in drive C 136.

Because in the expanded stripe 1 row the parity no longer belongs in drive C, the next-block pointer is again advanced to the next disk location and references DB5 on drive D 138. The next-free pointer references the stripe 1 location of drive B 134. Accordingly, DB5, as indicated by the next-block pointer, is relocated to the stripe 1 location of drive B 134, as indicated by the next-free pointer. Again, both pointers are advanced one location. The next-free pointer indicates the stripe 1 location of drive C 136. Advantageously, the next-block pointer does not traverse the added disk drive E 139 because it does not contain data which needs to be relocated. Therefore, the next-block pointer indicates that DB6 from the stripe 2 location of drive A 132 is the next block to be relocated. Accordingly, DB6 from drive A is relocated to the stripe 1 location of drive C 136 and the progression pointers are again updated. The next-free pointer now references the appropriate location for the parity in the second row of the disk array. At this point, the controller 106 recalculates the parity by exclusive ORing the preceding data blocks from the same row (i.e., DB4, DB5, and DB6), and stores the new parity, P1' at the stripe 1 location of drive D 138. Then, the next-free pointer is advanced one location to the stripe 1 position of drive E 139.

Because the stripe 1 location of drive E 139 is designated to contain data, the controller examines the next-block pointer to find a data block. However, the next-block pointer points to P2 which is the parity for the third row in the array 130. Because the parity is recalculated in the expanded array, parity from the old array need not be transferred to a new location. Therefore, the next-block pointer is advanced one location to the stripe 2 location of drive C 136 where DB7 currently resides. Next, the controller 106 relocates DB7 to the location indicated by the next-free pointer (i.e., the stripe 1 location of drive E 139) Because DB7 now corresponds to the parity, P1', the parity is updated by exclusive-ORing P1' with DB7. Subsequently, the progression pointers are advanced one location.

The next-free pointer now references the stripe 2 location of drive A 132 and the next-block pointer references the stripe 2 location of drive D 138, where DB8 is located. Because the next-free pointer now points to drive A 132, the controller 106 detects that it is beginning processing of a new row in the array. Accordingly, the entire row of the stripe 2 locations including P2 are stored in the temporary storage 137.

FIG. 3 depicts the expanding disk array 131 with stripes 0 and 1 expanded to incorporate the added disk drive E 139. In sum, FIGS. 2 and 3 illustrate that DB2 is moved from the stripe 1 location of disk A 132 to the stripe 0 location of drive D 138, and that the parity P0' for stripe 0 has been calculated and stored on disk E 139. FIGS. 2 and 3 further illustrate that DB4 is moved from the stripe 1 location of drive B 134 to the stripe 1 location of drive A 132; that DB5 is moved from the stripe 1 location of drive D 138 to the stripe 1 location of drive B 134; that DB6 is transferred from the stripe 2 location of drive A 132 to the stripe 1 location of drive C 136; and that DB7 is moved from the stripe 2 location of drive B 134 to the stripe 1 location of drive E 139. The parity P1' for stripe 1 of the new array 131 has been calculated and stored in disk D 138, which is the appropriate position for a RAID 5 system, as is well known in the art. Advantageously, the data transfers in the present invention are executed from disk to disk through the buffers in the disk controller 106, as is well known in the art.

In one embodiment, as soon as the next-free pointer is advanced beyond the appropriate position of the parity in an expanding row, a flag (hereinafter the "post-parity" flag) is set to indicate that any data written to the row beyond the parity will be incorporated into the newly calculated parity. By using such a post-parity flag, any data relocations which move data to positions in a row which precede the new parity location can be accomplished through a standard write operation, and any relocation of data to positions in a row which fall after the position of the newly calculated parity are executed using a RAID 5 write operation. This provides a time savings by allowing some write operations to be carried out without performing a RAID 5 write which is more time consuming.

Each time an entire row is expanded, the flag that indicates that the parity for the row being processed is located in the temporary storage 137 is cleared.

The next-free pointer not only indicates the location of the next stripe to be transferred, but is also used by the controller 106, in conjunction with the logical address passed to the hard disk controller 106 by the operating system during an I/O request, to determine how the data is accessed during progression of the restriping. As is well understood in the art, the operating system requests data from the disk array by providing the hard disk controller 106 with a logical address (e.g., head, cylinder and sector) of the data disk referenced from the beginning of the volume as if the volume were a single disk. The operating system derives this information from the file allocation table index in the DOS environment (or other file system in other environments). In general, in a conventional multiple-disk array, the controller calculates a disk index from the information provided by the operating system, adjusts the index for the parity located in the array and executes an integer divide on the index by the number of disks in the array to determine where the data is located. The result of the division operation indicates the disk containing the data and the remainder of the division operation indicates where on the disk the data is located. Advantageously, the operations of the hard disk controller in interpreting the address information provided by the operating system are transparent to the operating system.

During the progression of the restriping operations according to the present invention, if the operating system requests data (executes a read operation), the hard disk controller 106 determines where the data is located by adjusting the calculation depending on whether the data requested is located before or after the next-free pointer. For instance, if the operating system requests a block of data located after the next-free pointer, the hard disk controller 106 divides the index it generates by the number of disks in the original array to determine where the data is located (i.e., the disk, head, cylinder and sector). If the block of data requested is before the next-free pointer, the hard disk controller 106 divides the index by the number of disks in the expanded array to locate the data.

In the exemplary system of FIGS. 2 and 3, if the operating system requests data located before the next-free pointer, the hard disk controller divides the index by 5 (e.g., in FIG. 3 if the file was in stripes 0 or 1). If the operating system requests data at an address located after the next-free pointer, the hard disk controller 106 divides by 4 (e.g., in FIG. 3 if the file was in stripe 2 or after). This enables the system to properly access the data located at addresses before and after the next-free pointer. Even though at some point, data may be located both before and after the next-free pointer (e.g., in FIG. 3, DB6 and DB7 are located in both stripe 1 and stripe 2), if the data has been relocated to an expanded stripe, the controller retrieves the data located before the next-free pointer.

In one embodiment, if the operating system requests that the controller 106 write data to the disk array during restriping, the controller 106 determines if the address is located in a row of the array which is currently being processed. If the request is not in a row being processed, the controller 106 executes the write operation (e.g., a conventional RAID 5 write including an update of parity), as previously described for a read operation. If the address of the data requested is in the row being processed, the controller 106 completes the expansion of the row being processed before servicing the I/O request from the operating system. This minimizes the risk of the parity in the row not reflecting the current state of the data in the row under process.

As explained, FIG. 3 illustrates the position of data on the new disk array 131 after stripe 0 and stripe 1 have been restriped. If no I/O requests are pending, or if the disk controller 106 services pending requests and detects another lull in I/O, the controller 106 begins with the next stripe, and proceeds with the remaining stripes in the same manner. The restriping of the expanding disk array 131 continues until all of the old data is relocated.

After completion of the restriping of the data, the system has available storage space at the "end" of each disk, as illustrated in FIG. 4 as stripe 3. In one embodiment, the disk controller reports the available space to the operating system as a new volume of storage. FIG. 4 illustrates an exemplary embodiment with the old data configured as volume H and the additional storage configured as volume I. In order for the hard disk controller 106 to properly report the disk space to the operating system, a new device driver is installed which includes information such as the size of the volume, the location in the memory map, and the file allocation table information for the volume, as is well understood in the art. As illustrated in FIG. 4, after the new driver is installed for the exemplary system, the new volume I is recognized by the operating system as volume I. Subsequent accesses to volume I by the operating system are with logical addresses referenced from the beginning of volume I. The process of writing a driver is well known in the art and is described in the Microsoft Technical Reference Manual for OS/2 and DOS operating systems.

In the present embodiment, the new volume I incorporates redundancy similar to the system in the original volume H. For instance, in the exemplary system of FIG. 4, both volume H and volume I have RAID 5 redundancy in the form of parity. The hard disk controller 106 calculates the parity for volume I as the new volume fills with data.

The RAID 5 system was chosen as an exemplary system because of the complexities associated with keeping track of the parity information during the data transfer. In simpler systems such as RAID 4, the parity block is easy to locate because it is always stored on the last disk of the array. To upgrade a RAID 4 array using the methods of the present invention, only the parity block of the row being expanded, rather than the entire row, is copied to the temporary storage 137. The temporary storage flag indicates that the parity block has been temporarily moved into the temporary storage. The data blocks are then relocated to fill the free space, and the new parity for each stripe is calculated and placed on the new disk. The temporary storage flag is cleared after each row is expanded and the new parity calculated.

If the disk array is a non-parity system, the process becomes even easier. Once a new disk is added, the data blocks are relocated sequentially to fill the free space, one block at a time. The progression pointers again maintain the status of the restriping until all of the old data has been relocated at the appropriate position in the expanded array.

Figure 5:
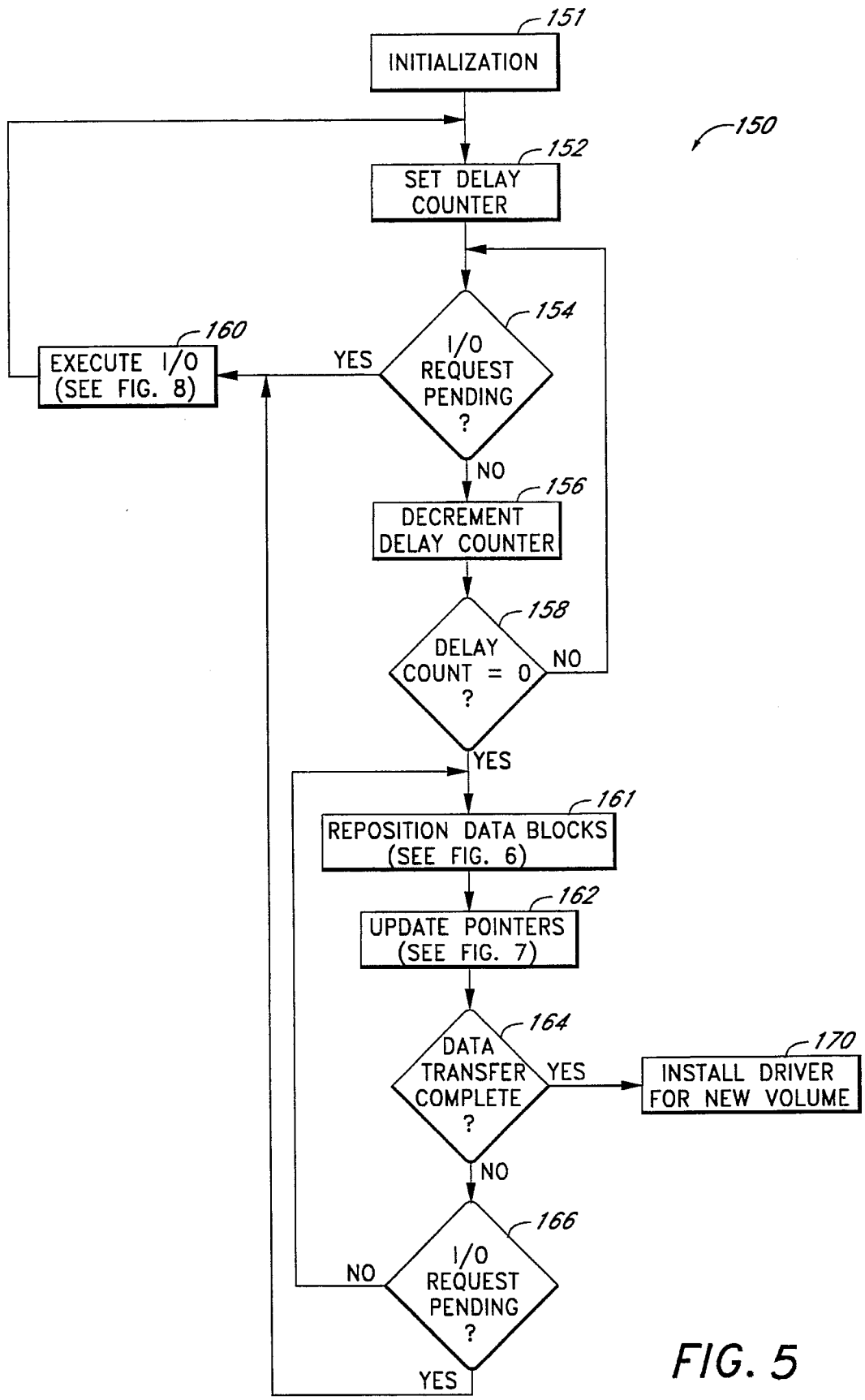
FIG. 5 depicts an exemplary flow chart for the disk restriping process according to the present invention.

The restriping process from the perspective of the hard disk controller 106 is explained below with reference to the flow charts of FIG. 5, FIG. 6, FIG. 7, and FIG. 8. FIG. 5 illustrates an exemplary flow chart 150 of the overall restriping procedure. The first operation executed by the controller 106 is to initialize the progression pointers and the various flags used during operation, as represented in an action block 151. For instance, for the array 130 expanded to the five disk array 131, the next-free pointer is initialized to indicate the stripe 0 location of drive D 138 and the next-block pointer is initialized to indicate the stripe 1 location of drive A 132. As previously explained, this is because DB0, DB1, and DB2 need not be relocated because no free space is introduced by the addition of drive E 139. Once the pointers and flags are initialized, the hard disk controller 106 waits for a lull in I/O before it begins restriping. This step is depicted in blocks 152–158 of the flow chart. First, a delay counter is set as represented in an action block 152. The delay counter is set for a predetermined period of time appropriate for the respective system. This period may change from system to system, depending on the environment and the I/O requirements. However, in a typical environment a delay period of a few seconds without I/O requests is sufficient. Once the delay counter is initialized, the hard disk controller 106 determines if any I/O requests are pending, as represented in decision block 154. If no I/O requests are pending, the delay counter is decremented, as represented in an action block 156, and the delay count is checked to determine if it is zero (i.e., the delay period has expired and a lull has been detected), as represented in a decision block 158. If the delay count is not zero, then execution continues at the decision block 154, with a determination of whether an I/O request is now pending.

If an I/O request is pending (action block 154), the I/O request is executed, as represented in an action block 160. Execution of the I/O request is explained in more detail below with reference to FIG. 8. Upon completion of the I/O request, execution continues at decision block 152 by initializing the delay counter. In other words, each time the operating system requests an I/O operation, the request is executed, the delay period is reset, and the hard disk controller 106 again begins waiting for the delay period to expire. This process continues until the hard disk controller 106 detects a lull (i.e., the delay counter times out without further I/O requests from the operating system).

When the controller 106 detects a lull, it repositions data blocks from the old disk array 130 until an I/O request is issued, as illustrated in action blocks 161–166. Because the pointers were initialized, they maintain the location on the disk array which is available to receive a data block and the position on the disk array which contains the next data block to be relocated. Therefore, the first step is to relocate the data block from its old position to a new position in an expanded row, as depicted in an action block 161 and as further explained below in reference to FIG. 6. Once the data block has been relocated, the pointers are updated, as represented in an action block 162 and as further explained below in reference to FIG. 7. After each block is relocated, the controller 106 checks to see if all the data has been repositioned in the expanded disk array 131, as represented in a decision block 164. If all the data has not been repositioned, the controller 106 checks to see if any I/O requests are pending, as represented in a decision block 166. If no I/O requests are pending, the next block of data is repositioned, as represented in the action block 161, without resetting the delay counter. By not resetting the delay counter until after I/O has been requested, multiple transfers can be made during a single lull period.

If the hard disk controller 106 detects an I/O request at decision block 166, then it executes the I/O request, as represented in the action block 160, the delay counter is then reset (action block 152), and the hard disk controller 106 waits for another lull period. The entire process continues until all rows in the disk array have been expanded and a transfer complete condition is detected in decision block 164. Once the restriping is complete, a driver is installed to report the new volume of data to the operating system, as represented in action block 170.

Figure 6:
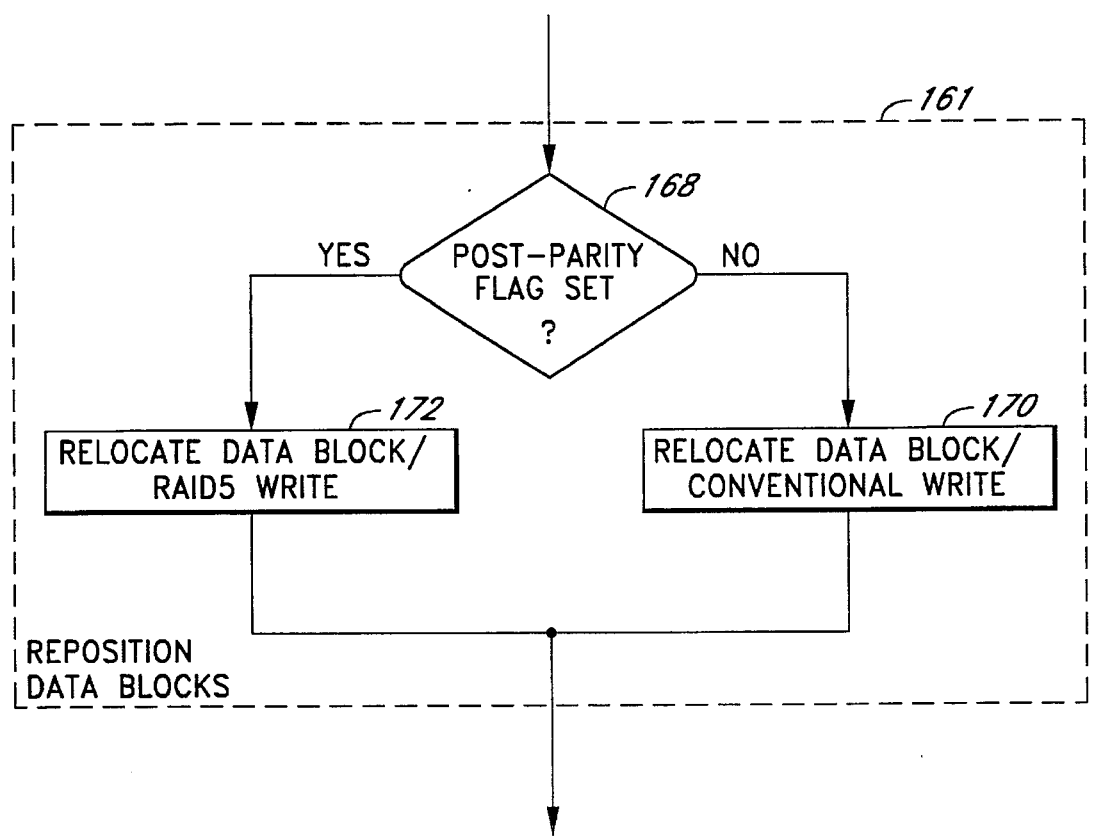
FIG. 6 depicts an exemplary flow chart for the step of repositioning data blocks shown in the flow chart of FIG. 5.

FIG. 6 is a flow chart depicting in more detail the steps involved in relocating the data blocks (action block 161 of FIG. 5) into expanded rows in the disk array 131. The first step, as illustrated in a decision block 168, is to determine if the next free location is after or before the new parity location in the expanding row. In the present embodiment, this is accomplished by checking the post-parity flag. If the post-parity flag is not set, indicating that the next free location is before the new parity location in the expanding row, the controller 106 relocates the data block referenced by the next-block pointer to the location referenced by the next-free pointer using a conventional write operation to the new location as indicated in an action block 170.

If the next free location is after the new parity location of the expanding row, the controller 106 relocates the data block referenced by the next-block pointer to the location referenced by the next-free pointer using a conventional RAID 5 write which updates the parity in the row, as represented in an action block 172. In an alternative embodiment, the write operations could all be executed using the conventional RAID 5 write. However, this would require more time than the method just described.

Figure 7:
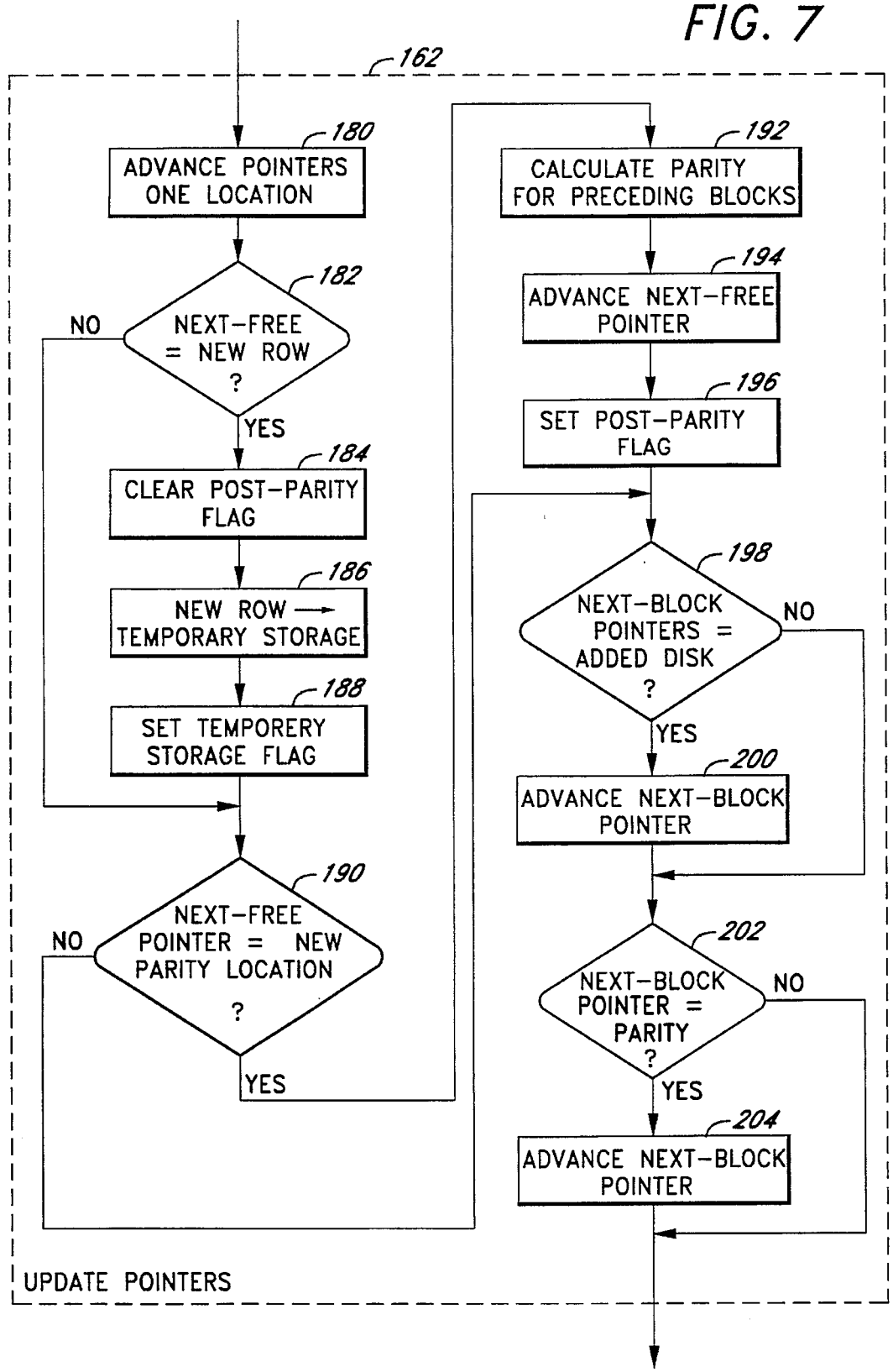
FIG. 7 depicts an exemplary flow chart for the step of updating the pointers shown in the flow chart of FIG. 5.

FIG. 7 illustrates a flow chart depicting in more detail the step of updating the pointers, as represented in the action block 162 of the flow chart 150 of FIG. 5. The first step in updating the pointers is to advance each pointer to the next location in the disk array (i.e., to reference the next location in the array from a logical address standpoint). The controller 106 then checks the next-free pointer to determine if it has moved to a new row (e.g., as seen in FIG. 3, the next-free pointer has moved back to disk A 132), as represented in a decision block 182.

If the next-free pointer has been advanced to a new row, the controller 106 clears the post-parity flag, as represented in an action block 184, stores the corresponding new row in the temporary storage location 137, as represented in an action block 186, and sets a flag (the temporary storage flag), indicating that the next row is located in the temporary storage 137, as represented in an action block 188. The controller then proceeds to a decision block 190. If the next-free pointer has not moved to a new row (decision block 182), the controller 106 proceeds to determine if the next-free pointer references the appropriate parity location for the expanded row in the disk array, as represented in the decision block 190.

If the next-free pointer references the new parity location, the controller 106 proceeds to calculate the parity based on the blocks of data preceding the new parity location in the current row being processed, as represented in an action block 192. The controller 106 then advances the next-free pointer, as represented in action block 194, and sets the post-parity flag, as represented in an action block 196, because the next-free pointer references a location subsequent to the new parity location in the expanding row. The controller then proceeds to a decision block 198. If the next-free pointer does not reference the new parity location, or the steps of action block 192–196 have been executed, the controller 106 determines if the next-block pointer references the added disk, as represented in the decision block 198.

If the next-block pointer references the added disk, then the controller 106 advances the next-block pointer, as represented in an action block 200, and continues at a decision block 202. If the next-block pointer does not reference the added disk, the controller 106 determines if the next-block pointer references an original parity location from the unexpanded array, as represented in the decision block 202. Because parity is recalculated as the array is updated, there is no need to reposition the old parity onto the expanded array. Therefore, if the next-block pointer references an original parity location, the next-block pointer is advanced to the next disk in the array, as represented in an action block 204.

Figure 8:
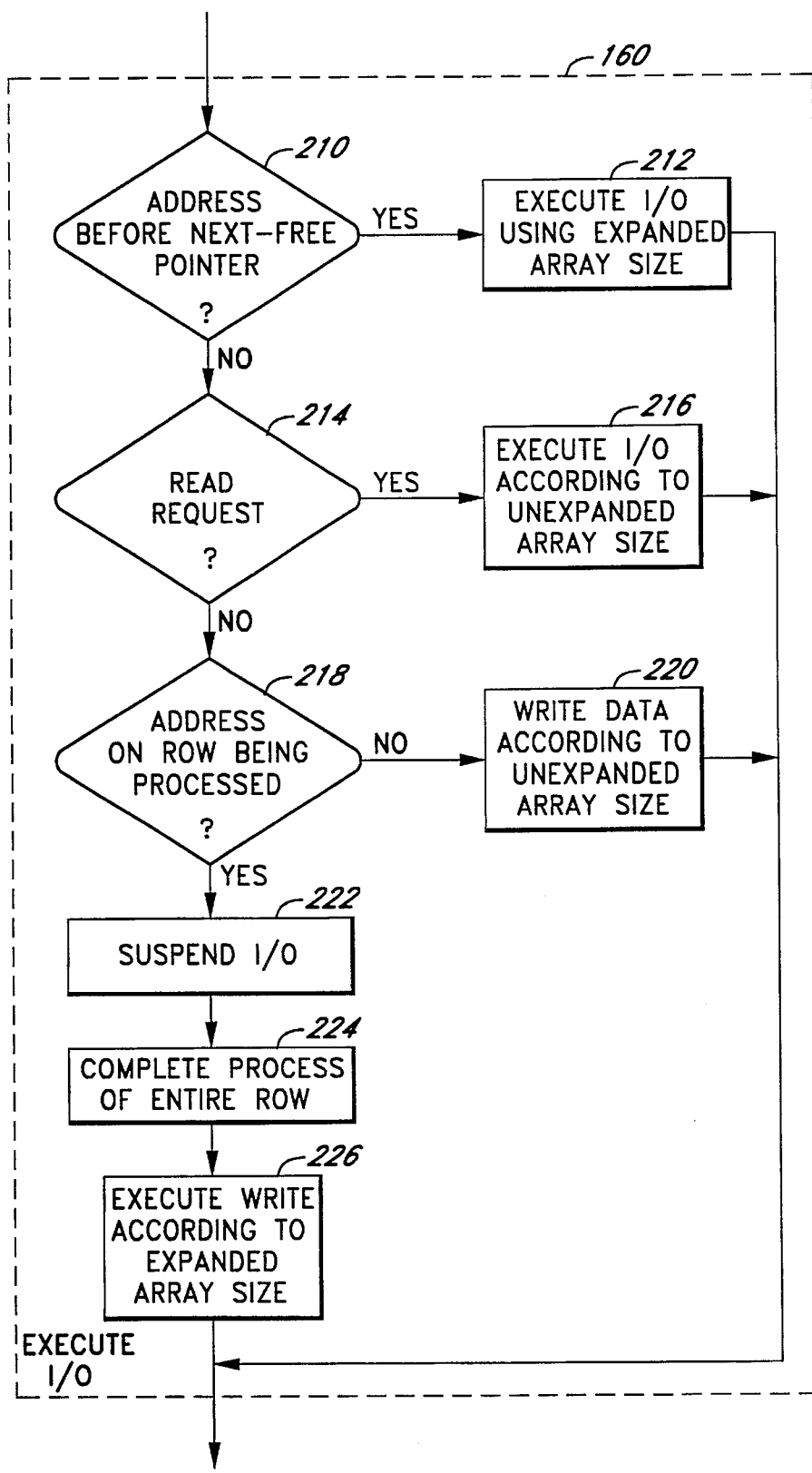
FIG. 8 is an exemplary flow chart of the execute I/O step depicted in FIG. 5.

FIG. 8 is a flow chart detailing the steps incorporated in the execute I/O step, the action block 160 in FIG. 5. As previously explained, the I/O requests from the operating system are serviced in different manners depending upon the address of the I/O request. The first step as depicted in FIG. 8 is to determine if the address is before the next-free pointer, as represented in a decision block 210. In other words, the controller 106 determines if the address is located in the expanded portion of the array.

If the address is before the next-free pointer, the controller 106 executes the I/O using the expanded array size as previously explained, as represented in an action block 212. If the address is not before the next-free pointer, then the controller 106 determines if the I/O request is a read request, as represented in a decision block 214.

If the request is a read request, the controller 106 executes the read request using the size of the unexpanded array for calculation, as represented in an action block 216. If the I/O request is not a read request, a controller 106 determines if the address is located on the row currently being processed, as represented in a decision block 218.

If the address is not located on the row being processed, the address is located after the row being processed and the controller 106 executes the write operation using the size of the unexpanded array for calculations as illustrated in action block 220. If the address is on the row being processed, the controller 106 suspends I/O, as represented in an action block 222, and then completes processing the entire row which is being expanded, as represented in an action block 224. Once the entire row is expanded, the controller 106 executes the pending write using the size of the expanded array for calculations, as represented in an action block 226. Suspending I/O in this matter minimizes the chances that the parity in the row will not reflect the data which is contained in the row being processed.

Although the flow chart 150 depicts checking for I/O requests in the action blocks 154 and 166, I/O requests often generate interrupts, as is well known in the art. Thus, detecting a lull may be an interrupt driven task in an alternative embodiment. In other words, a delay timer counts the delay period during which no I/O interrupts occur. If the delay period expires without an I/O interrupt occurring to the hard disk controller 106, then the hard disk controller 106 begins repositioning data.

As described, the present invention provides a method for the expansion of a striped disk array which allows the array to remain in use except for short periods during which a data stripe is being processed.

Although the preferred embodiment of the present invention has been described and illustrated above, those skilled in the art will appreciate that various changes and modifications can be made to the present invention without departing from its spirit. Accordingly, only the scope of the following appended claims limit the present invention.

What is claimed is:

1. A method of expanding a striped hard disk array for a computer system during computer system operation, said hard disk array controlled by a hard disk controller which reports to a computer operating system an original data storage capacity of the array when the array is in a first fully operational configuration and which receives requests for access to the array from said operating system, the first fully operational configuration of the array having at least two original physical disk drives with data striped across the disks, wherein the corresponding stripe for each disk in the array is one row, the method comprising the steps of:

(a) adding at least one added physical disk drive to the two original disk drives in the disk array to create an upgraded data storage capacity in a second fully operational configuration of the array, the second fully operational configuration comprising the original disk drives and the added disk drive, said upgraded storage capacity being an increase from said original data storage capacity;

(b) selecting a row in the disk array for expansion to incorporate a portion of the added disk;

(c) waiting for a predetermined delay period during which the operating system issues no requests for access to the disk array;

(d) preventing access by the operating system to the disk array once the predetermined period expires;

(e) selecting a data block in the original disk drives in the disk array for expansion;

(f) relocating said data block to fill a storage location created in the selected row by the addition of the added disk drive;

(g) identifying with a first indicator the next free location in the array to be expanded;

(h) identifying with a second indicator the next data block in the array to be relocated;

(i) permitting the operating system to access the hard disk array; and (j) reporting to the operating system said upgraded storage capacity of the second fully operational configuration of the array.

2. The method as defined in claim 1, further comprising the steps of:

waiting a predetermined delay period during which the operating system issues no requests for access to the disk array if a request for access to the disk array was pending at the step (i);

preventing access to the disk array;

repeating steps (e) through (i) for the remaining data blocks in the disk array until all rows incorporate the added disk drive, wherein once the entire array is expanded, each disk will have an available storage space at its physical end; and configuring the available storage space as a new volume.

3. The method of claim 1, wherein the disk array is a RAID 4 system having existing parity for each row in the array which contains data, said parity stored in the last disk in the array for each row, the method further comprising the steps of:

copying the existing parity for a stripe of data to a temporary storage location;

setting a flag to indicate that the existing parity is located in the temporary storage location;

calculating a new parity for said row incorporating a portion of the new disk drive;

storing the new parity in the last disk in the selected row; and clearing said flag.

4. The method of claim 1, wherein said striped disk array is a RAID 5 system having parity for each stripe in the array, said parity for each stripe distributed among the disks in the array, the method further comprising the steps of:

copying the selected row of data, including the parity, from the hard disk array to a temporary storage location;

setting a flag to indicate that the selected row is located in the temporary storage location;

calculating a new parity for the expanded row;

storing the new parity in a predetermined disk in the expanded row; and clearing said flag.

5. The method of claim 1, wherein a disk access request is issued to the hard disk controller while the expansion is in progress, further comprising the steps of:

determining if the data requested is stored before or after the row indicated by said first indicator; and accessing the appropriate location in the disk array by calculating the location of the data accounting for the disks in the expanded array if the request is before the location referenced by the first indicator or accounting for the disks in the original array if the request is after the location references by the first indicator.

* * * * *